(12) United States Patent
Popovic et al.

(10) Patent No.: US 9,535,098 B2
(45) Date of Patent: Jan. 3, 2017

(54) CURRENT TRANSDUCER FOR MEASURING AN ELECTRICAL CURRENT

(71) Applicant: Senis AG, Zug (CH)

(72) Inventors: Radivoje Popovic, Zug (CH); Marjan Blagojevic, Nis (RS); Nebosja Radosevic, Nis (RS)

(73) Assignee: Senis AG, Zug (CH)

( * ) Notice: Subject to any disclaimer, the term of this patent is extended or adjusted under 35 U.S.C. 154(b) by 256 days.

(21) Appl. No.: 14/472,327

(22) Filed: Aug. 28, 2014

(65) Prior Publication Data

US 2015/0084617 A1    Mar. 26, 2015

(30) Foreign Application Priority Data

Sep. 2, 2013   (EP) .................................. 13182636

(51) Int. Cl.
*G01R 15/18*    (2006.01)
*G01R 15/20*    (2006.01)

(52) U.S. Cl.
CPC .................. *G01R 15/207* (2013.01)

(58) Field of Classification Search
CPC ..... G01R 15/207; G01R 15/18; G01R 15/183; G01R 15/185; G01R 15/186; G01R 15/20; G01R 15/202; G01R 33/06; G01R 33/07; G01R 33/072; G01R 33/077
See application file for complete search history.

(56) References Cited

U.S. PATENT DOCUMENTS

| 6,215,296 B1* | 4/2001 | Arnoux ................ G01R 15/207 324/117 R |
| 2002/0149356 A1* | 10/2002 | Wenger .............. G01R 19/0092 324/117 R |
| 2006/0232902 A1 | 10/2006 | Woolsey et al. |
| 2010/0001715 A1* | 1/2010 | Doogue ............... G01R 15/207 324/117 H |

(Continued)

FOREIGN PATENT DOCUMENTS

| EP | 2 151 692 A2 | 2/2010 |
| EP | 2 515 125 A2 | 10/2012 |

OTHER PUBLICATIONS

Ripka, Pavel, "Electric current sensors: a review", Measurement Science and Technology, vol. 21, No. 11, pp. 1-23, 2010.

*Primary Examiner* — Minh N Tang
*Assistant Examiner* — David Frederiksen
(74) *Attorney, Agent, or Firm* — Nixon Peabody LLP

(57) ABSTRACT

The present invention concerns current transducers for measuring a current flowing through a cable. The current transducers have a ferromagnetic core providing a substantially ring-shaped portion and at least two legs. The ring-shaped portion has one air gap or two air gaps. A magnetic field sensor is placed in or at each of the air gap(s). The ring-shaped portion forms a magnetic circuit that encloses the cable and guides the magnetic field generated by current to the air gap(s). Each leg extends from the center of the associated magnetic field sensor in a direction that runs perpendicularly to the longitudinal axis of the cable and has a certain length. The length of the legs is designed so long that at least two magnetic paths are formed which guide a component of an external magnetic field which extends in the direction of the legs around the magnetic field sensor(s).

6 Claims, 14 Drawing Sheets

(56) References Cited

U.S. PATENT DOCUMENTS

| | | | |
|---|---|---|---|
| 2011/0121828 A1* | 5/2011 | Gati | B82Y 25/00 |
| | | | 324/252 |
| 2012/0268114 A1* | 10/2012 | Disselnkotter | G01R 15/207 |
| | | | 324/253 |
| 2012/0306486 A1 | 12/2012 | Racz et al. | |
| 2014/0009146 A1 | 1/2014 | Blagojevic et al. | |

* cited by examiner

CURRENT TRANSDUCER FOR MEASURING AN ELECTRICAL CURRENT

PRIORITY CLAIM

Applicant hereby claims foreign priority under 35 U.S.C §119 from European Patent Application No. 13182636.4 filed Sep. 2, 2013, the disclosure of which is herein incorporated by reference.

FIELD OF THE INVENTION

The invention relates to a current transducer for measuring an electrical current flowing through a cable.

BACKGROUND OF THE INVENTION

A current transducer, also known as current sensor, is a device that transforms an electrical current to be measured, also called primary current, into another easily measurable electrical quantity, such as a current of the order of milliamps, or voltage of the order of volts. The current transducers that are subject of this invention belong to the group of isolated current transducers, also known as isolated DC/AC current transducers. Such current transducers provide electrically isolated current measurement, i.e. the conductor with the primary current is isolated from the output circuit of the transducer;

are capable of measuring both direct currents (DC) and alternating currents (AC);

may have either a fixed geometry, or can be opened and re-assembled around a cable conducting the primary current, without having to disconnect the cable; such current transducers are known as clip-on, clampon, or split-core current transducers.

The principle of operation of the known isolated current transducers is based on the measurement of the magnetic field associated with the current in the enclosed cable. The state-of-the-art of current transducers is described in the paper by Pavel Ripka, "Electric current sensors: a review", MEASUREMENT SCIENCE AND TECHNOLOGY 21 (2010) 112001, pp. 1-23.

Briefly, an isolated current transducer usually consists of a combination of a ferromagnetic core, magnetic field sensor, and electronic circuit for signal conditioning. The ferromagnetic core, which encloses a current-carrying cable, serves to guide the magnetic flux generated by the electrical current in the cable, and to concentrate this flux on the magnetic field sensor. The magnetic field sensor converts the magnetic field into an electrical signal. The electronic circuit supplies the magnetic field sensor with a suitable electrical current and amplifies, filters, and conditions the signal coming from the magnetic field sensor. In the version of current transducers known as open-loop current transducers, the output signal of the current transducer is the conditioned signal of the magnetic field sensor. There is also a class of current transducers known as closed-loop current transducers. A closed-loop current transducer has a coil wound around the ferromagnetic core, and the electronic circuit is configured to supply a current, called secondary current, to this coil, which compensates the magnetic flux generated by the primary current. The secondary current is the output signal of the closed-loop current transducer.

Measurement accuracy of the known isolated current transducers is severely limited by the sensitivity of the measurement system to external magnetic fields (for example, the magnetic fields associated with the currents in neighbouring cables).

In the following throughout the specification the current to be measured is called primary current. The magnetic field generated by the primary current is called primary magnetic field. Furthermore, the ferromagnetic core is sometimes simply referred to as core.

DESCRIPTION OF THE PRIOR ART

FIG. 1 shows a scheme of an isolated open-loop current transducer according to the prior art. The current transducer comprises a ring-shaped or toroidally-shaped ferromagnetic core 1 having an air-gap 2 in which a magnetic field sensor 3 is placed. The ferromagnetic core 1 encloses a cable 4 through which the primary current flows. The primary current is represented by a point 5. The point 5 indicates an arrow oriented towards the reader.

FIG. 2A shows a variation of the current transducer of FIG. 1, in which the core 1 consists of two pieces 1a and 1b. The two pieces 1a and 1b of the core 1 are divided by an additional air gap 6, which is much narrower than the air gap 2. Such a current transducer which can be opened and re-assembled around a cable 4 conducting the primary current 5 is known as a split-core current transducer.

FIG. 3 shows a variation of the current transducer of FIG. 2A, in which the two pieces 1a and 1b of the core 1 are separated by two equal air gaps 2a and 2b. A magnetic field sensor 3a or 3b, respectively, is placed in each of the air gaps 2a and 2b.

FIGS. 4A and 4B show a variation of the current transducer of FIG. 3, in which the two pieces 1a and 1b of the core 1 are placed in two mutually parallel planes, which are perpendicular to the longitudinal axis 4a of the cable 4. The two air gaps 2a (not visible) and 2b are situated in a plane between the pieces 1a and 1b, which is also perpendicular to the axis 4a of the cable 4. Magnetic field sensors 3a and 3b are placed in the air gaps 2a and 2b.

In FIGS. 1, 2A, 3, 4A and 4B, the magnetic field sensors 3a and 3b are usually Hall effect devices. The Hall effect devices are electrically connected with a suitable electronic circuit for biasing and signal conditioning, which is not shown in FIGS. 1, 2A, 3, 4A and 4B. In the case of a closed-loop current transducer, a coil is wound around the core 1 which is not shown in FIGS. 1, 2A, 3, 4A and 4B.

A major deficiency of the current transducers of the prior art is the dependency of their output signal on external magnetic fields. For example, with reference to FIG. 2B, an external magnetic field $B_{ext}$ extending along the same direction as the primary magnetic field B in the air gap, will produce in the air gap 2a a parasitic magnetic field $B_{par}$. The parasitic magnetic field $B_{par}$ cannot be distinguished from the primary magnetic field B, which should be measured. For a core 1 made of a ferromagnetic material of very high-permeability and with very small air gaps, the parasitic magnetic field $B_{par}$ is approximately given by the following equation:

$$B_{par} \approx D_{ext}^2/(a*b)*(g_p/g_1)*B_{ext} \tag{1}$$

Here $D_{ext}$ denotes the external diameter of the core 1, a and b are the dimensions of the rectangular cross-section of the core 1, and $g_1$ and $g_p$ are the thicknesses of the air gaps 2 and 6, respectively. The term $D_{ext}^2/(a*b)$ comes from the effect of the concentration of the external magnetic flux into the core 1. This will be further referred to as the magnetoconcentration effect. The term ($g_p/g_1$) represents the sharing ratio of the concentrated magnetic flux among the two air gaps 2 and 6.

In the current transducers shown in FIGS. 3 and 4A and 4B, the influence of the external magnetic field is mutually cancelled in the two magnetic field sensors 3*a* and 3*b* if the external magnetic field is homogeneous and the ratio of the magnetic sensitivity of the magnetic field sensor 3*a* or 3*b* to the thickness of the corresponding air gap 2*a* or 2*b* are perfectly equal. But in practice the external magnetic field is scarcely homogeneous and it is difficult to fulfil this equality condition.

EP 2 515 125 A2 discloses a current transducer with two overlapping U-shaped cores, similar to that shown in FIGS. 4A and 4B. Apart of the effects described above with reference to FIGS. 4A and 4B, the sensitivity to an external field along the longitudinal axis of the core of EP 2 515 125 A2 is further reduced by increasing the ratio of the area of the air gap to the area of the cross-section of the core. Thanks to this measure, the magnetic flux densities "seen" by the magnetic field sensors 3*a*, 3*b* are diluted, i.e. distributed over a larger area of the air gap. But this means that the sensitivity to the external magnetic field is only reduced, not eliminated. Moreover, a high ratio of the area of the air gap to the area of the cross-section of the core leads to a decrease of the magnetic field produced by the current 5 flowing through the enclosed cable 4, so that this solution does not much improve the signal to disturbance ratio of the current transducer.

Several attempts have been made to improve the immunity of current transducers to external magnetic fields by adding magnetic shields around the intrinsic transducer structure. The principle of the magnetic shielding is to enclose the object to be shielded into a box of a high-permeability material, which guides a major part of the external magnetic flux around the shielded object. But in order to be efficient, a magnetic shield has to be closed and multi-layered. Moreover, a magnetic shield can only reduce, not eliminate, the influence of the external magnetic field.

US 2012/306486 A1 discloses a current transducer with a U-shaped core 1, which encloses both the cable 4 and the magnetic field sensor 3. The U-shaped core shields the magnetic field sensor from an external magnetic field. But the shielding effect is poor since the U-shaped core 1 is neither a closed nor multi-layered shield. Therefore, here again, the disturbing influence of the external magnetic field is only reduced, not eliminated.

SUMMARY OF THE INVENTION

The object of the invention is to develop a current transducer with high immunity to disturbing magnetic fields.

The present invention concerns current transducers for measuring a current flowing through a cable. The current transducers have a ferromagnetic core providing a substantially ring-shaped portion and at least two legs.

The magnetic field is a vector field which is described in the following by the three components X, Y and Z of a Cartesian coordinate system. The X-component designates the component that runs parallel to the legs of the core. The Z-component designates the component that runs parallel to the longitudinal axis of the cable. The Y-component designates the component that runs perpendicularly to the legs of the core and perpendicularly to the longitudinal axis of the cable.

A first type of current transducers according to the invention has a ferromagnetic core with one air gap and a magnetic field sensor placed in or at the air gap. The ferromagnetic core comprises a substantially ring-shaped portion which encloses the cable and forms a magnetic circuit that guides the magnetic field generated by the current flowing through the cable to the air gap and therefore to the magnetic field sensor. The ferromagnetic core further comprises a first leg and a second leg. The first leg is coupled to a first end of the ring-shaped portion near the air gap and extends in a predetermined direction that runs perpendicularly to the longitudinal axis of the cable. The second leg is coupled to a second end of the ring-shaped portion near the air gap and extends in a direction opposite to the predetermined direction.

A second type of current transducers according to the invention has a ferromagnetic core with two air gaps and two magnetic field sensors each placed in or at one of the air gaps. The output signals of the magnetic field sensors are coupled, correctly according to their sign, to provide an output signal responsive to the current flowing through the cable. The ferromagnetic core comprises a ring-shaped portion which encloses the cable and forms a magnetic circuit that guides the magnetic field generated by the current flowing through the cable to the air gaps and therefore to the magnetic field sensors. The first air gap and the second air gap lie at diametrically opposite sides of a center of the ring-shaped portion so that the magnetic field produced by the current flowing through the cable points in opposite directions at the locations of the two magnetic field sensors while an external magnetic field points in the same direction at the locations of the two magnetic field sensors. The ferromagnetic core further comprises a first pair of legs and a second pair of legs. The first leg of the first pair extends from the location of the first magnetic field sensor in a predetermined direction that runs perpendicularly to the longitudinal axis of the cable and the second leg of the first pair extends from the location of the first magnetic field sensor in a direction opposite to the predetermined direction. The first leg of the second pair extends from the location of the second magnetic field sensor in the predetermined direction and the second leg of the second pair extends from the location of the second magnetic field sensor in a direction opposite to the predetermined direction. So all legs run parallel to each other.

The legs of the ferromagnetic core have the function to collect the component of an external magnetic field extending in the direction of the legs, i.e. in the predetermined direction, "far" away from the magnetic field sensor(s) and to guide it to the ring-shaped portion without that magnetic field lines of the external magnetic field pass through the magnetic field sensor(s). The legs and the ring-shaped portion form magnetic paths that pass the magnetic field sensor(s) on two sides of each magnetic field sensor. Preferably, these sides lie opposite to each other. In order to achieve a complete elimination of the influence of this component of the external magnetic field on the output signal of the magnetic field sensor(s) the legs must be appropriately designed. The most important parameter to design is the length of the legs. The optimum length of the legs may vary depending on the shape of the foot or end portion of the legs.

With certain designs of the ferromagnetic core, the output signal of the magnetic field sensor(s) does not depend on the Z-component of the external magnetic field. With certain other designs of the ferromagnetic core, the legs have to be formed with further legs (mainly in the form of protrusions) extending in the Z-direction and located near the magnetic field sensor(s). These protrusions have the function to guide the Z-component of the external magnetic field around the magnetic field sensor(s). The novel structure of the ferromagnetic core allows to significantly reduce and in the best case even eliminate the influence of external magnetic fields on the output signal of the current transducer.

The magnetic field sensors are placed in or at the air gaps. While Hall effect devices are usually placed in the air gaps, magnetoresistive sensors may be placed adjacent the air gaps. The placement of the magnetoresistive sensors can be as described in the U.S. patent publication 2014/0009146 A1 which is incorporated by reference.

The ferromagnetic pieces may have the shape of a Ω, U, a cornered U, a V or of a capital Greek Pi, or any similar shape. Two of them may be arranged so as to form the magnetic circuit and at least two magnetic paths.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE INVENTION

Figure 5:
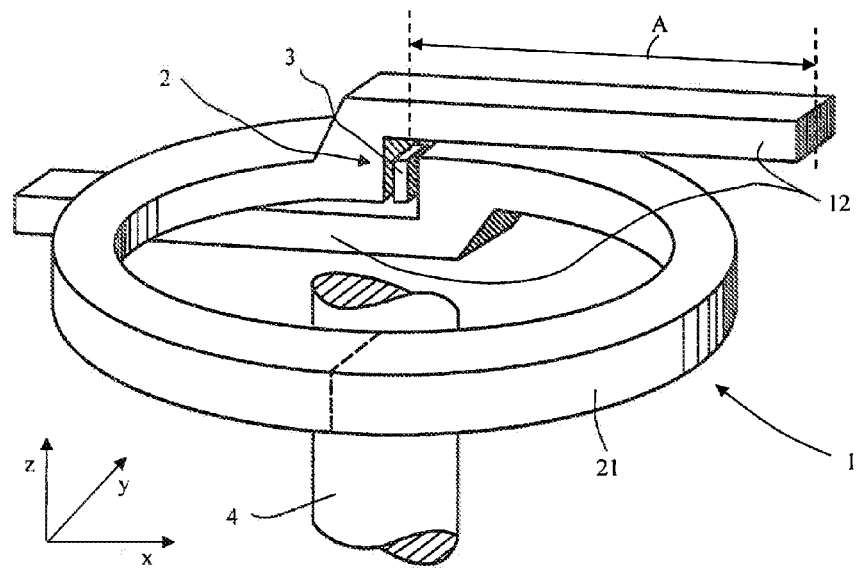
FIG. 5 shows an embodiment of a current transducer of a first type according to the invention.

FIG. 5 shows a perspective view of an embodiment of a current transducer according to the invention. The current transducer comprises a ferromagnetic core 1 with an air gap 2 and a magnetic field sensor 3 placed in (as shown) or at the air gap 2. The core 1 may be made of a single ferromagnetic piece as shown, but may also be composed of two or more ferromagnetic pieces. The ferromagnetic core 1 comprises a ring-shaped portion 21, which encloses the cable 4, and two legs 12. The ring-shaped portion 21 forms a magnetic circuit that encloses the cable 4 and concentrates the magnetic flux generated by the current flowing through the cable 4 in the air gap 2. The legs 12 provide magnetic paths that guide the magnetic flux of the component of the external magnetic field that extends parallel to the legs, i.e. the X-component, around the magnetic field sensor 3. The magnetic paths pass the magnetic field sensor 3 on two sides of the magnetic field sensor 3 lying opposite to each other. The ring-shaped portion 21 may be circular, as shown, or rectangular or of any other suitable shape.

The structure of the ferromagnetic core 1 may be described as follows: The ring-shaped portion 21 is a ring with the air gap 2. The legs 12 are part of a piece having the shape of the letter "L". The piece essentially consists of two bars running perpendicularly to each other. The front side of the end of the small side of the "L" of the first leg 12 extends from the one end of the ring-shaped portion 21, and the front side of the end of the small side of the "L" of the second leg 12 extends from the other end of the ring-shaped portion 21, so that the small side of the "L" is flush with the air gap 2 and the long side of the "L" passes adjacent the air gap 2. Each of the legs 12 is preferably formed as integral part of at least an adjacent part of the ring-shaped portion 21. The legs 12 extend in directions opposite to each other. The magnetic field sensor 3 is placed in the air gap 2 such that it is sensitive to the X-component and insensitive to the Y- and Z-component of the magnetic field. The length, denoted by A, of the legs 12 is the distance between the location of the magnetic field sensor 3 and the end of the leg 12 along the X-axis. The length A of the legs 12 is so long that the legs 12 have a portion that does not overlap with the ring-shaped portion 21. This non-overlapping portion reduces the penetration of the magnetic field sensor 3 by the X-component of the external magnetic field and therefore the sensitivity of the magnetic field sensor 3 to the X-component of the external magnetic field, while the sensitivity to the magnetic field generated by the current flowing through the cable 4 is not affected at all. The influence of the X-component of an external magnetic field on the output signal of the magnetic field sensor is therefore reduced, and may in the optimum case even be eliminated.

Figure 6:
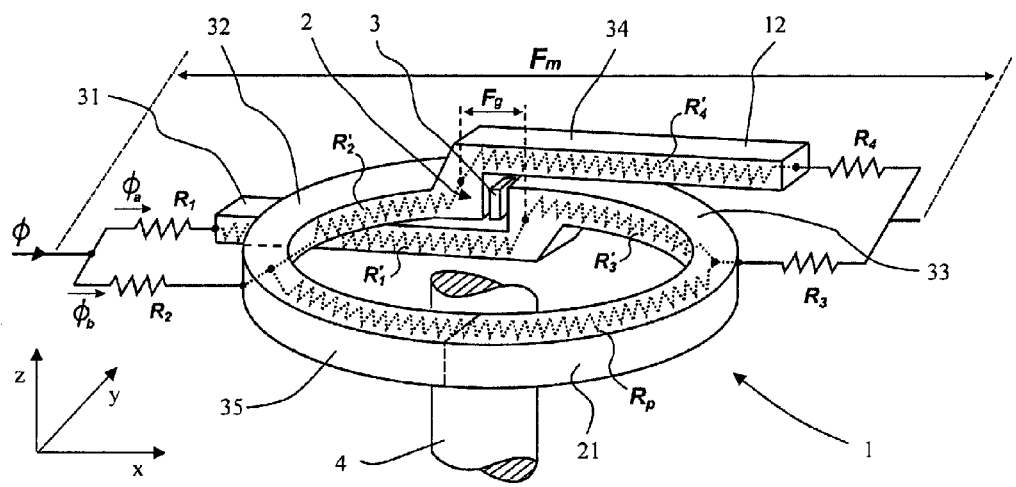
FIG. 6 illustrates the magnetic behavior of a ferromagnetic core of the current transducer shown in FIG. 5.

The optimum length $A_{opt}$ of the legs 12, at which the influence of the external magnetic field is eliminated, may either be determined experimentally or calculated with the aid of computer simulations. The following considerations which are explained with reference to FIG. 6 serve to understand the determination of the optimum length $A_{opt}$ of the legs 12. With regard to the X-direction of the external magnetic field the ferromagnetic core 1 can be considered to be composed of five parts or components 31 to 35. The two components 32 and 33 are each substantially formed of a quarter arch of the ring-shaped portion 21 adjacent the air gap 2. The two components 31 and 34 are each substantially formed of one of the legs 12 and a portion coupling the leg 12 to the corresponding arch of the ring-shaped portion 21. The fifth component 35 is a semicircular arch of the ring-shaped portion 21 formed by a magnetic path through which a portion of the magnetic flux of the X-component of the external magnetic field flows that circumvents the air gap 2 and the magnetic field sensor 3. In a first approximation, the fifth component 35 may be neglected, so that in analogy to a Wheatstone bridge formed by four resistors through which an electrical current flows, the four components 31 to 34 may be considered to form the four branches of a magnetic bridge through which the flux of the X-component of the external magnetic field flows wherein the magnetic field sensor 3 is placed in the diagonal branch of the magnetic bridge. The magnetic reluctance of each branch of the magnetic bridge is composed of a reluctance $R_1'$ to $R_4'$ of the respective component 31 to 34 and a reluctance of the respective air space $R_1$ to $R_4$ between the end of the respective component 31 to 34 and infinity, as illustrated in FIG. 6. For symmetry reasons we have $R_1=R_4$, $R_1'=R_4'$, $R_2=R_3$ and $R_2'=R_3'$. If the magnetic bridge is in equilibrium no flux of the X-component of the external magnetic field passes through the magnetic field sensor 3. Under the assumption that the influence of the fifth component 35 can be neglected the magnetic bridge is in equilibrium if $$R_1+R_1'=R_2+R_2' \qquad (2)$$

The condition (2) can be met by adjusting the length A of the legs 12. The existence of the component 35 and its reluctance $R_p$ makes the analysis more complicated, but it does not compromise the basic idea of the invention that, by adjusting the length A of the legs 12, the magnetic bridge can be brought to equilibrium, so that the magnetomotive force $F_g$ over the air gap vanishes, $F_g=0$, and, therefore, the magnetic field sensor 3 does not "see" the X-component of the external magnetic field. Therefore, the components 31 and 33 of the ferromagnetic core 1 form a first magnetic path and the components 32 and 34 of the ferromagnetic core 1 form a second magnetic path that guide the X-component of the external magnetic field around the magnetic field sensor 3.

Figure 7:
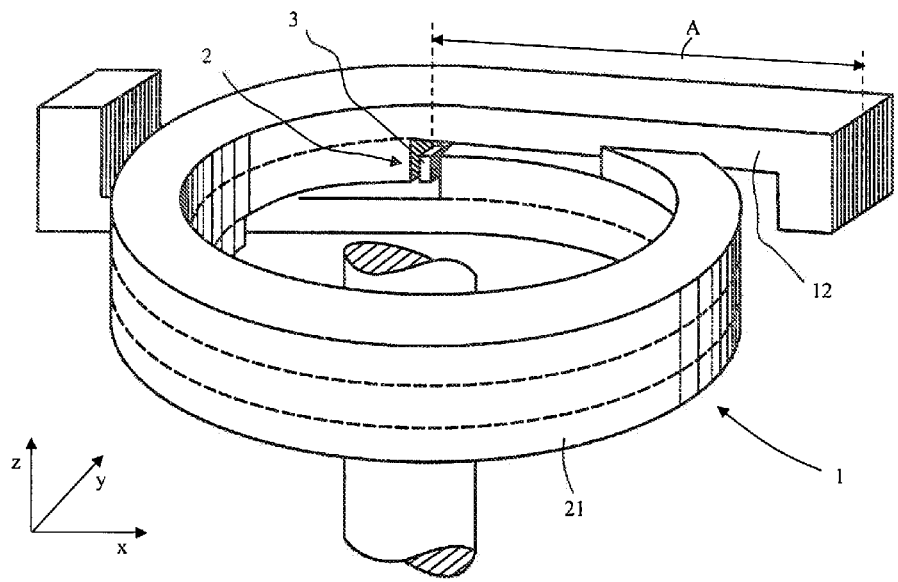
FIG. 7 shows a further embodiment of a current transducer of a first type according to the invention.

While the length A of the legs 12 is the main parameter to set the magnetic reluctance $R_1'$ and $R_2'$ of the components 31 and 34 and of the related air-reluctances $R_1$ and $R_2$, there are other parameters like the shape of the legs 12 which also have an impact. The legs 12 may for example be formed with feet which have an increased cross-section with regard to the cross-section nearer the air gap 2. The size of the feet has an influence on the optimum length of the legs 12. Furthermore, the shape of the ferromagnetic core 1 may be changed to a form that is suitable for composing it of several different layers of ferromagnetic material, e.g. as a stack of laminated ferromagnetic sheets. FIG. 7 illustrates such an embodiment of the current transducer.

Figure 8:
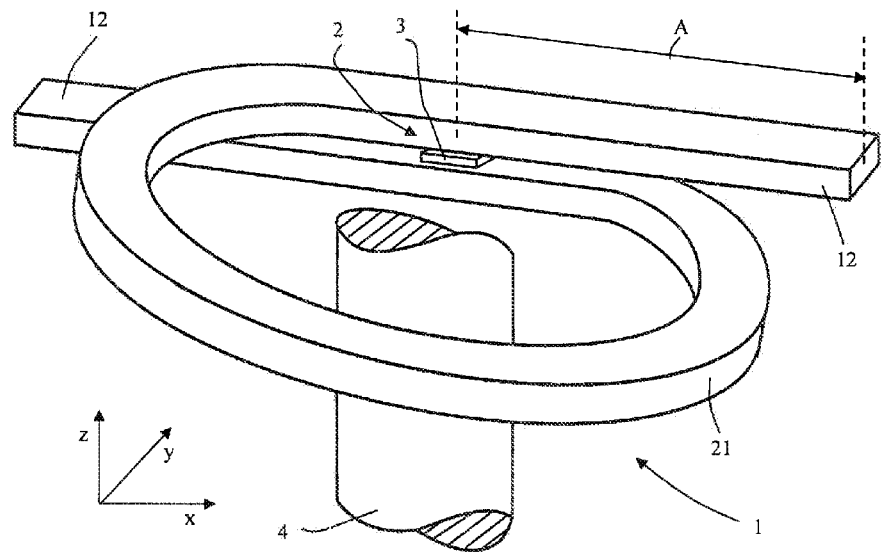
FIGS. 8, 9 and 9A show further embodiments of a current transducer of a first type according to the invention.
Figure 9:
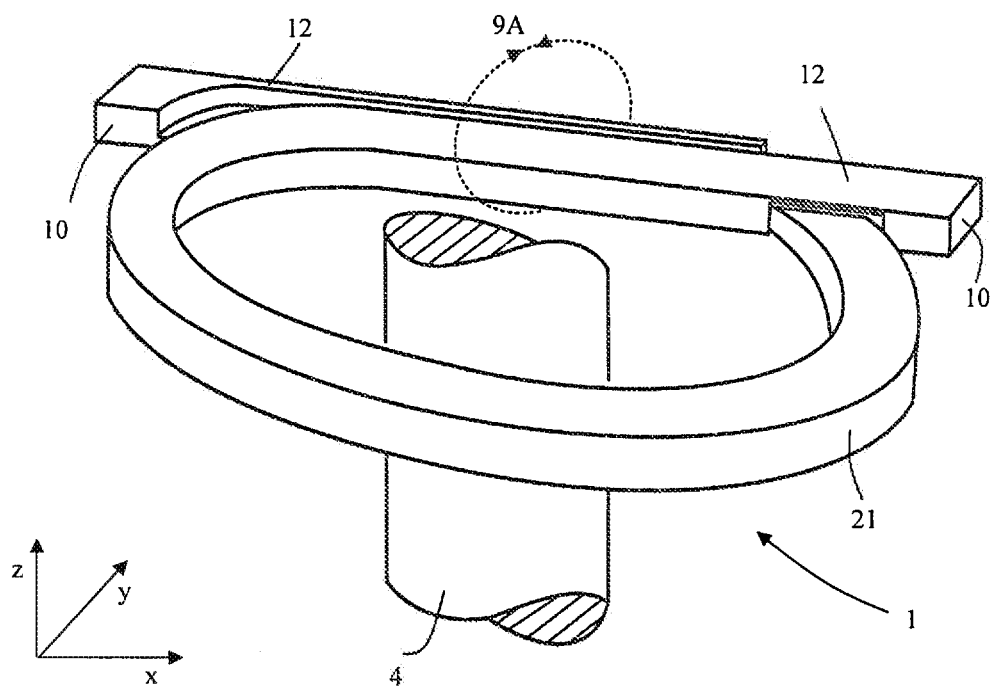
Figure 9A:
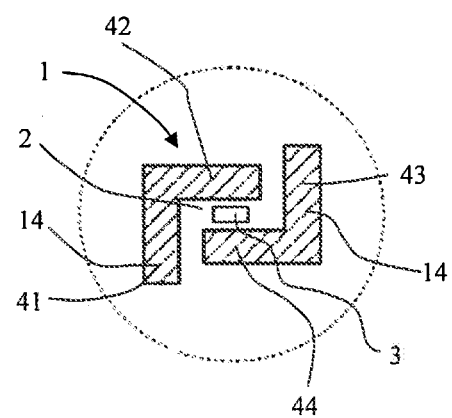

FIG. 8 shows a perspective view of a further embodiment of a current transducer according to the invention. The ferromagnetic core 1 has a first leg 12a, a ring-shaped portion 21 and a second leg 12b and is formed of a continuous ribbon. The orientation of the air gap 2 and of the magnetic field sensor 3 is different from that in FIG. 5, namely such that the magnetic field sensor 3 is sensitive to the Z-component and insensitive to the X- and Y-component of the magnetic field. However, if the legs 12 are too short or too long, the magnetic field sensor 3 is also sensitive to the X-component of the external magnetic field since this component is turned locally at the location of the magnetic field sensor 3 into a Z-component. The length A of the legs 12 is therefore selected as in the previous embodiments such that no magnetic flux generated by the X-component of the external magnetic field passes through the magnetic field sensor 3. Because the magnetic field sensor 3 is sensitive to the Z-component of the magnetic field, including the Z-component of the external magnetic field, additional measures need to be taken to overcome this drawback. One measure is to add second legs 14 to the ferromagnetic core 1 as shown in FIGS. 9 and 9A. Another measure is to use a ferromagnetic core 1 having two air gaps with two magnetic field sensors, as shown in FIG. 11.

Figure 10:
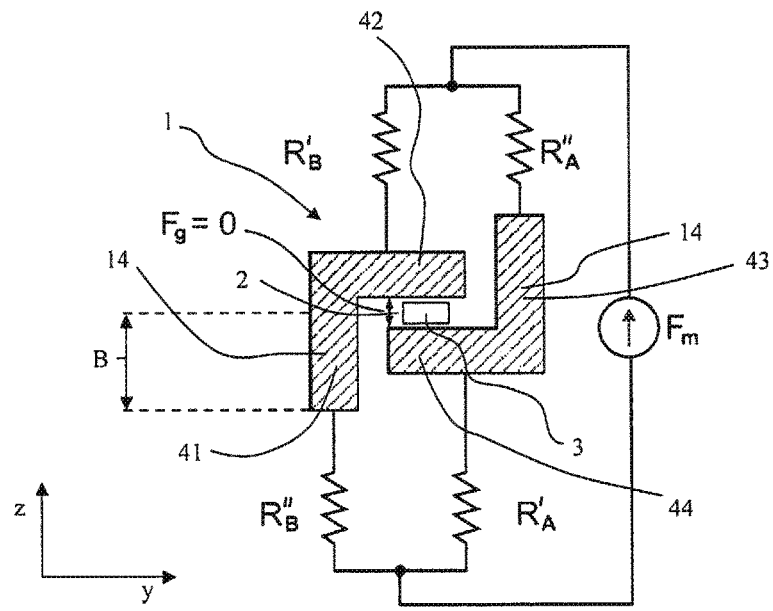
FIG. 10 illustrates the magnetic behavior of a ferromagnetic core of the current transducer shown in FIGS. 9 and 9A, FIGS. 11, 12A show embodiments of a current transducer of a second type according to the invention.

FIGS. 9 and 9A show a perspective view of a current transducer as shown in FIG. 8 where the ferromagnetic core 1 has second legs 14 which extend in the Z-direction and are arranged adjacent to the magnetic field sensor 3. The second legs 14 are preferably formed as integral parts of the ferromagnetic core 1. Again, but now with regard to the Z-component of the external magnetic field, the ferromagnetic core 1 can in a first approximation be considered to be locally composed of four components 41 to 44, namely the two legs 14 and two adjacent sections of the ferromagnetic core 1, each component having a magnetic reluctance. One of the legs 14 and the associated section of the ferromagnetic core 1 form a structure with the shape of the letter "L". The four components 41 to 44 form a magnetic bridge with the magnetic field sensor 3 aligned in the diagonal branch of the bridge. FIG. 10 shows a cross-section of the ferromagnetic core 1 at the place of the magnetic field sensor 3, i.e. a cross-section in the YZ-plane, of the current transducer shown in FIGS. 9 and 9A, in order to illustrate the magnetic reluctances related to the Z-direction. Each leg 14 forms a magnetic path that guides the Z-component of an external magnetic field around the magnetic field sensor 3. The length of the legs 14 is selected such that no flux of the Z-component of the external magnetic field passes through the magnetic field sensor 3, i.e. the magnetomotive force $F_g$ of the Z-component of the external magnetic field vanishes in the air gap 2. This condition is met if the magnetic reluctance associated with each of the components 41 to 44 is the same, i.e. $R_A'=R_A''=R_B'=R_B''$ so that the magnetic bridge is in equilibrium. $F_m$ symbolizes the magnetomotive force generated by the Z-component of the external magnetic field that applies to the magnetic bridge. Therefore, this current transducer is insensitive to external magnetic fields of any direction.

Figure 11:
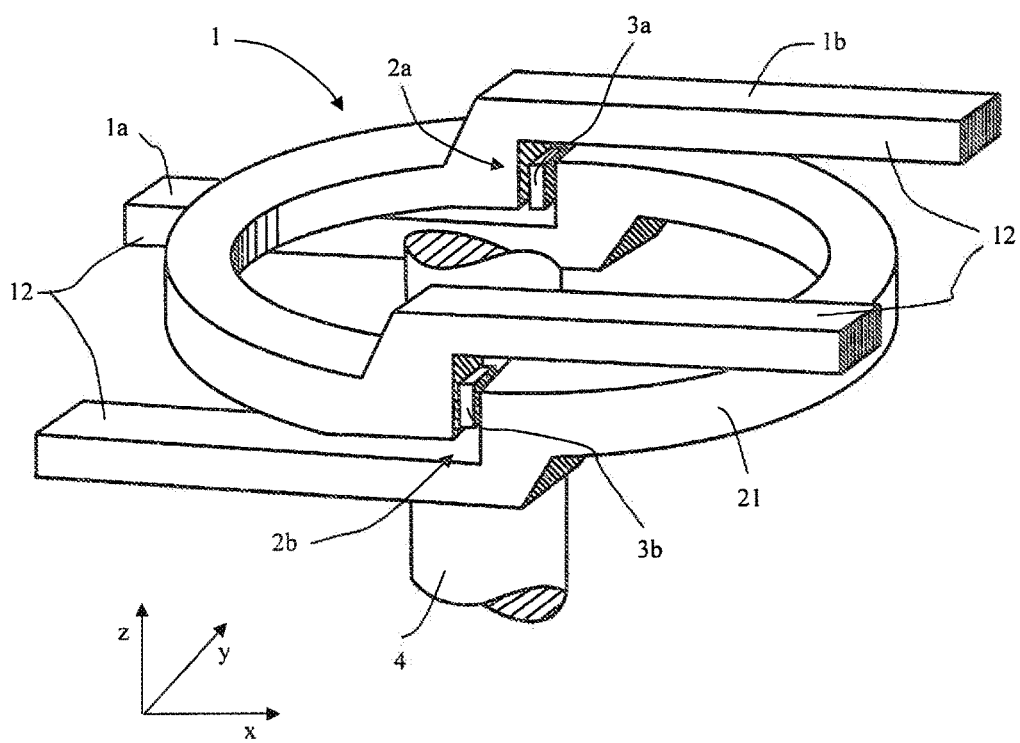
Figure 12A:
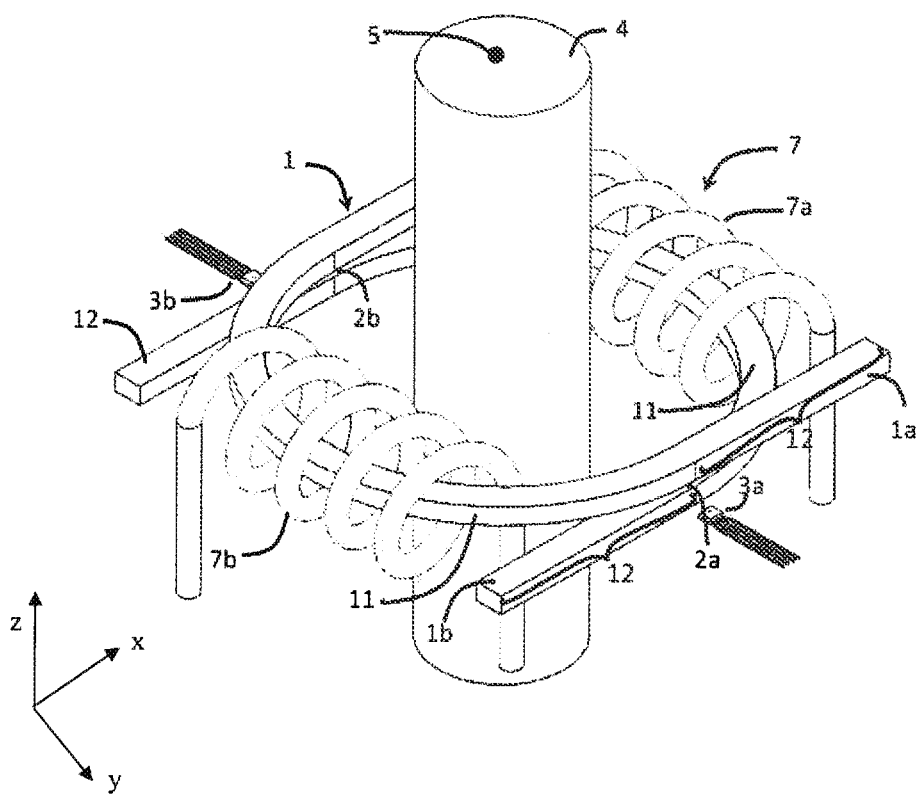
FIGS. 12B and 12C show sectional views of the current transducer of FIG. 12A.

FIGS. 11 and 12A show perspective views of further embodiments of a current transducer according to the invention which comprises a ferromagnetic core 1 with two air gaps 2a and 2b and two magnetic field sensors 3a and 3b placed in (as shown) or at the air gaps 2a and 2b. The ferromagnetic core 1 is composed of two ferromagnetic pieces 1a and 1b, each having a shape similar to the letter U (or a horseshoe). The pieces 1a and 1b are preferably of equal shape and size and oriented relative to each other with a rotary offset of 180°, i.e. they are rotated by 180° with respect to each other around the longitudinal axis of the cable 4. The pieces 1a and 1b form the ring-shaped portion 21 and four legs 12. With the current transducer shown in FIG. 11 the two magnetic field sensors 3a and 3b are oriented such that they are sensitive to the X-component and insensitive to the Y- and Z-component of the magnetic field. With the current transducer shown in FIG. 12A the two magnetic field sensors 3a and 3b are oriented such that they are sensitive to the Z-component and insensitive to the X- and Y-component of the magnetic field.

In FIG. 12A, the pieces 1a and 1b of the ferromagnetic core 1 are mutually arranged such that they form the ring-shaped portion 21 which encloses the cable 4 through which the current to be measured, i.e. the primary current 5, flows, and two pairs of two legs 12. The primary current is represented by a point 5 indicating an arrow oriented upwards. The two pieces 1a and 1b of the ferromagnetic core 1 are placed in different planes that run parallel to each other and extend perpendicularly to the longitudinal axis 4a of the cable 4 and are arranged at such a distance from each other that the two air gaps 2a and 2b are formed between the pieces 1a and 1b. The air gaps 2a and 2b typically have a width of around 1 mm. The magnetic field sensor 3a is placed in or at the air gap 2a, the magnetic field sensor 3b is placed in or at the air gap 2b. For reasons of clarity the magnetic field sensors 3a and 3b are shown outside of the air gaps. The magnetic field sensors 3a and 3b may be Hall effect devices or magnetoresistive sensors. The magnetic field sensors 3a and 3b are electrically connected with a suitable electronic circuit (not shown) for biasing and signal conditioning. Optionally, a coil 7 may be wound around the ferromagnetic core 1. The coil 7 may consist of two coil parts 7a and 7b. The coil 7, together with appropriate circuitry which is not shown, can be used for periodically demagnetizing the ferromagnetic core 1 and/or for operating the current transducer as closed-loop current transducer.

Figure 13:
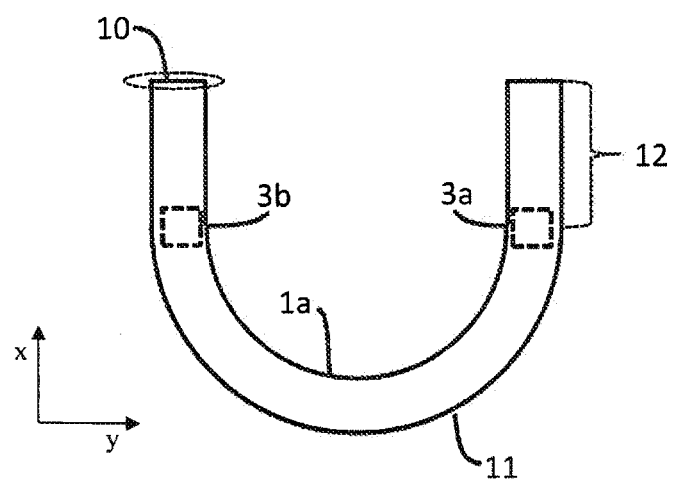
FIG. 13 shows a piece of a ferromagnetic core according to the invention.

FIG. 13 shows a plan view of the piece 1a of the ferromagnetic core 1 of the current transducer shown in FIG. 12A. The two magnetic field sensors 3a and 3b are attached to the piece 1a. The ends of the piece 1a will be referred to as foot 10. For the further discussion, it is convenient to describe the piece 1a as being composed of three segments as follows: The central segment of the piece 1a situated between the two magnetic field sensors 3a and 3b will be referred to as belt 11. The segment of the piece 1a extending from the magnetic field sensor 3a or 3b to its nearest foot 10 will be referred to as leg 12. So the pieces 1a, 1b have one belt 11 and two legs 12. The belt 11 shown in FIG. 13 has the form of an arc, with an arc angle of 180°; but the belt 11 may also have other similar forms, such as an arc with an angle smaller than 180°, or an approximation of an arc with piece-wise straight segments. The legs 12 shown in FIG. 13 are straight bars; but the legs 12 may have also other similar forms, such as slightly curved bars (an arc of an angle much smaller than 90°), or a form with piece-wise straight segments. Examples will be shown further below in FIGS. 18A, 18B, 18C, 18D, 18E, 18F and 18G.

If the length of the legs 12 is appropriately chosen as discussed above then the influence of the X-component of the external magnetic field may be strongly reduced, e.g. by more than 80%, or may in the best case even be eliminated. The legs 12 have a certain length and therefore a portion that does not overlap with the ring-shaped portion 21 which reduces the influence of the X-component of the external magnetic field. The optimum length $A_{opt}$ of the legs 12 is, however, selected such that no flux of the X-component of an external magnetic field passes through the sensors 3a and 3b. The length $A_{opt}$ may either be determined experimentally or by computer simulations. In the same manner as described with reference to FIG. 6 the different portions of the ferromagnetic core 1 form four magnetic paths that guide the X-component of the external magnetic field around the sensors 3a and 3b.

The electronic circuit for biasing and signal conditioning of the magnetic field sensors 3a and 3b is configured such that the output signals of the magnetic field sensors 3a and 3b generated by the primary magnetic field add up. The magnetic field sensors 3a and 3b therefore form a sensor pair. When placed and oriented in the same way, the output signals of the magnetic field sensors 3a and 3b have opposite signs and are therefore subtracted from each other to form a difference signal which forms the output signal of the current transducer.

The output signal of the current transducers shown in FIGS. 5 and 11 are independent on any external magnetic field if the legs 12 have the optimum length $A_{opt}$ as described above. However, the current transducer shown in FIG. 11 has the advantage that it is less sensitive to the exact position of the cable 4 in the opening enclosed by the ring-shaped portion 21 than the current transducer shown in FIG. 5.

The primary magnetic field created by the primary current points in opposite directions at the locations of the magnetic field sensors 3a and 3b. Therefore, the output signal of the current transducer shown in FIG. 12A is insensitive to the Z-component of a homogeneous external magnetic field, but still sensitive to the inhomogeneous part of the Z-component of the external magnetic field.

Figure 12B:
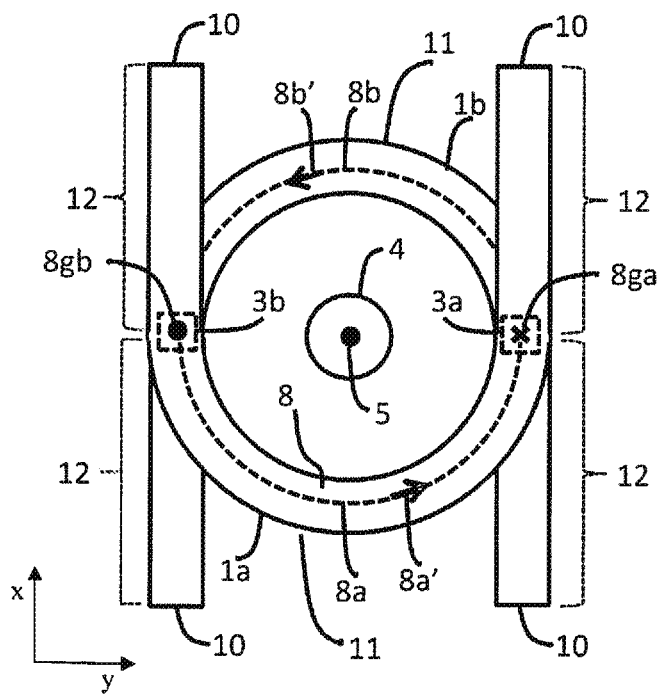
Figure 12C:
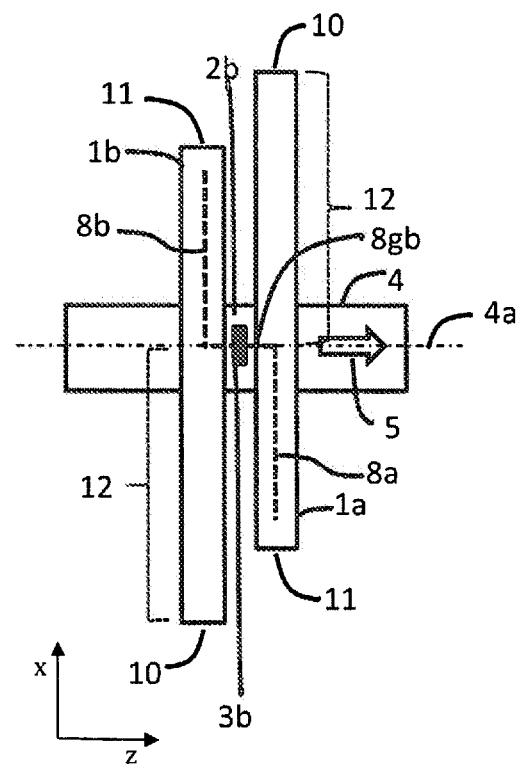

FIGS. 12B and 12C show sectional views of the current transducer of FIG. 12A wherein the coil 7 is not shown. These figures show an imaginary central line of the magnetic flux 8 generated by the primary current 5. The central line of the magnetic flux 8 is a closed line consisting of four parts, 8a, 8b, 8ga (not visible), and 8gb. The lines 8a and 8b have the form of a half-circle and are situated at the centre of the cross-sections of the belts 11 of the pieces 1a and 1b of the ferromagnetic core 1. The lines 8ga and 8gb are approximately straight, are perpendicular to the planes of the pieces 1a and 1b of the core 1, connect the ends of the lines 8a and 8b, and run through the air gaps 2a and 2b, respectively. The arrows 8a' and 8b' show the positive direction of the magnetic flux generated by the primary current 5. The direction of the primary magnetic field in the air gaps is shown in FIG. 12B: in the air gap 2a (not visible), the primary magnetic field is directed into the figure plane, which is indicated by a sign x denoted with 8ga; and in the air gap 2b (not visible), the primary magnetic field is directed out of the figure plane, which is indicated by a point 8gb.

Figure 14A:
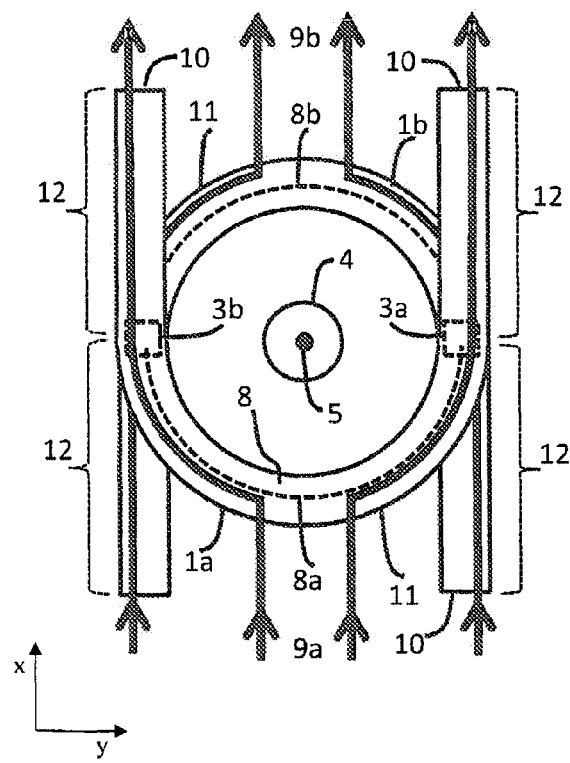
FIGS. 14A and 14B illustrate the behaviour of the current transducer of the present invention when exposed to an external magnetic field.
Figure 14B:
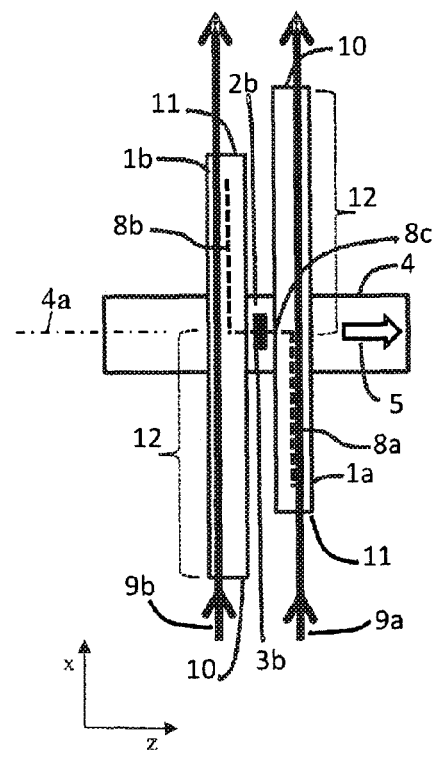
Figure 15:
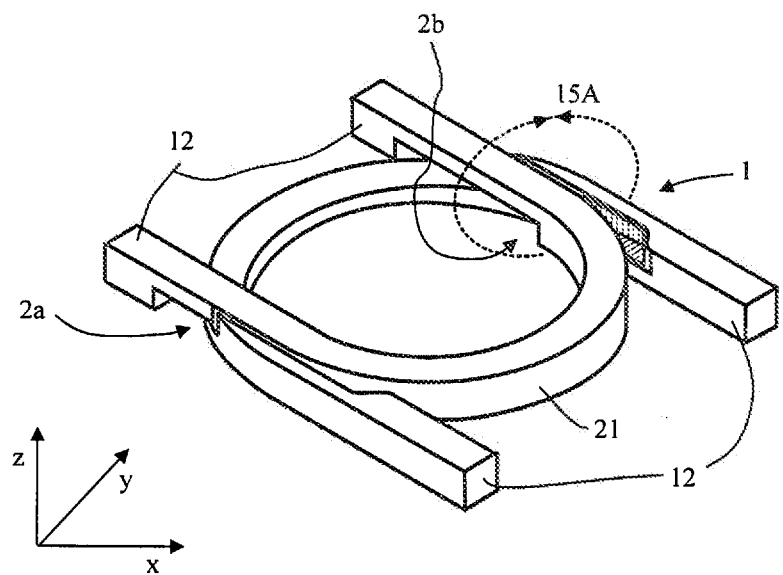
FIGS. 15, 15A, 16 and 16A show further embodiments of a current transducer of the second type according to the invention.
Figure 15A:
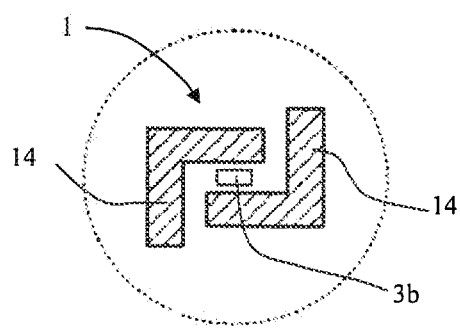
Figure 16:
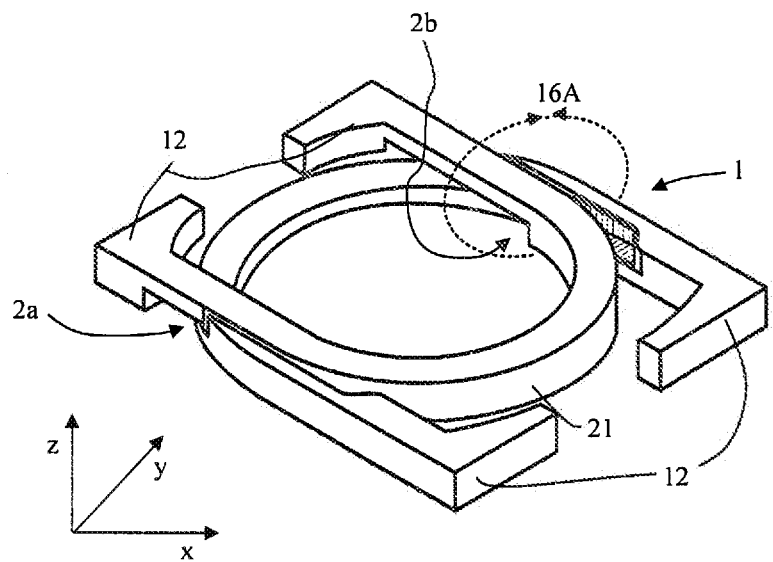
Figure 16A:
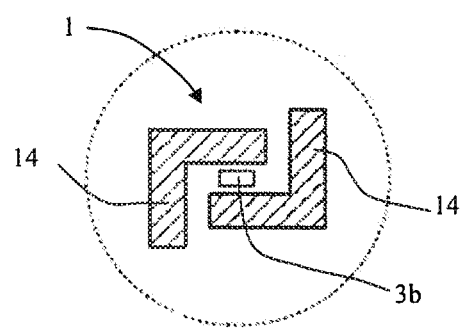

FIGS. 14A and 14B illustrate the behaviour of the current transducer shown in FIG. 12A when the current transducer is exposed to an external magnetic field that runs parallel to the symmetry axes of the pieces 1a and 1b of the ferromagnetic core 1, i.e. in X-direction. Such a magnetic field is associated with a magnetic flux 9, which is represented by the magnetic flux tubes 9a and 9b. Due to the fact that the pieces 1a and 1b of the ferromagnetic core 1 have legs 12 of optimum length $A_{opt}$, the magnetic flux 9a, which enters into the belt 11 of the piece 1a of the ferromagnetic core 1 at the lower side of the figure, runs mainly through the piece 1a and leaves it at its feet 10 at the upper side, without passing through the air gaps 2a and 2b; and also the magnetic flux 9b, which enters the piece 1b of the ferromagnetic core 1 at its feet 10 at the lower side of the figure, runs mainly through the piece 1b and leaves it at its belt 11 at the upper side, without passing through the air gaps 2a and 2b. The legs 12 create and are part of four magnetic paths that guide the X-component of the external magnetic field around the magnetic field sensors 3a and 3b. The four magnetic paths go on two opposite sides around the magnetic field sensors 3a and 3b (Two magnetic paths go around each sensor and pass preferably besides the sensor on two sides of the sensor lying opposite to each other). Since the external magnetic flux 9 does not pass through the air gaps 2a and 2b, it does not produce any output signal in the magnetic field sensors 3a and 3b. The shape of the ferromagnetic core 1 of the present invention ensures a self-shielding effect with respect to an external magnetic field that runs parallel to the symmetry axes of the pieces 1a and 1b of the core 1, i.e. parallel to the X-axis. Therefore, the current transducer is immune to such an external magnetic field.

FIGS. 15, 15A, 16 and 16A show additional embodiments of the current transducer according to the invention: Different shapes of the feet of the legs 12 result in different optimum lengths $A_{opt}$ of the legs 12. Furthermore, second legs 14 protruding in the Z-direction are added to the ferromagnetic core 1 near the locations of the magnetic field sensors 3a and 3b. The second legs 14 are designed as described above for the current transducer shown in FIG. 9. The second legs 14 make each of the magnetic field sensors 3a and 3b insensitive to the Z-component of the external magnetic field. Therefore, these current transducers are insensitive to homogeneous as well as to inhomogeneous external magnetic fields.

While in the embodiments shown hitherto the plane of the legs 12 is relatively near to the plane of the ring-shaped portion 21, the legs 12 may be designed to be further away from the plane of the ring-shaped portion 21.

Figure 1:
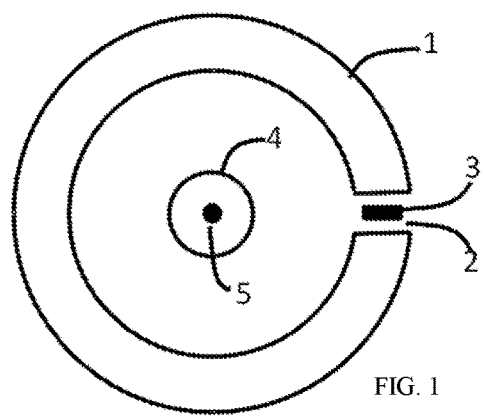
FIGS. 1, 2A, 2B, 3, 4A and 4B show different embodiments of current transducer according to the prior art.
Figure 2A:
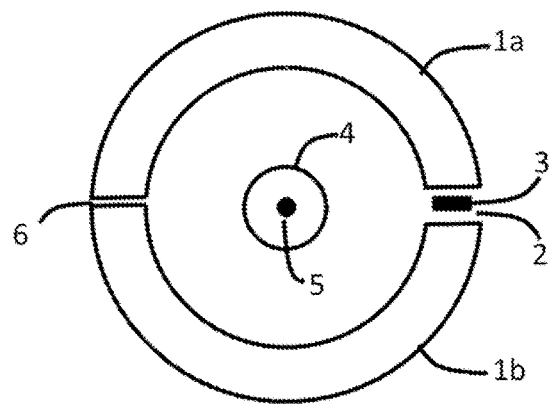
Figure 2B:
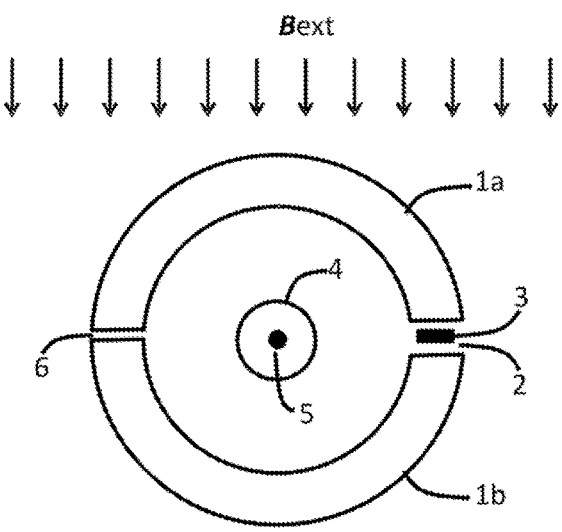
Figure 3:
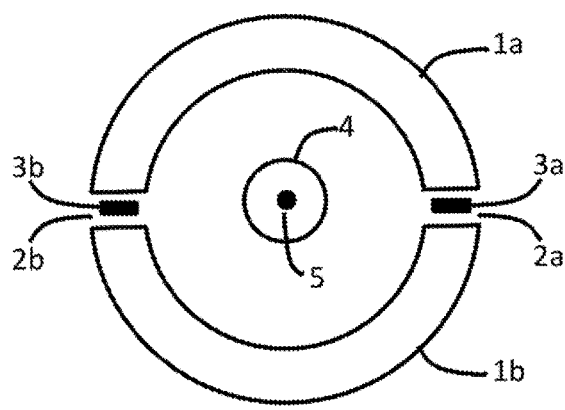
Figure 4A:
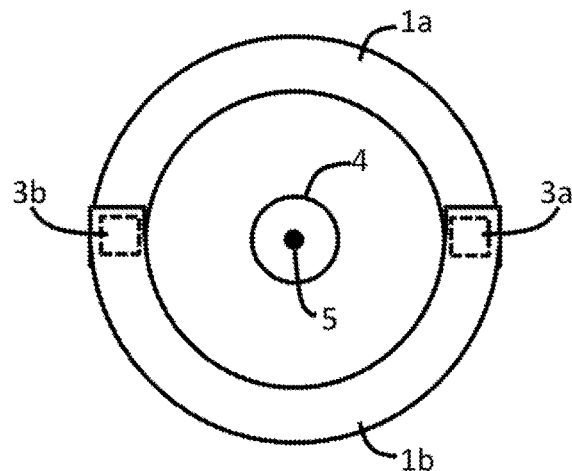
Figure 4B:
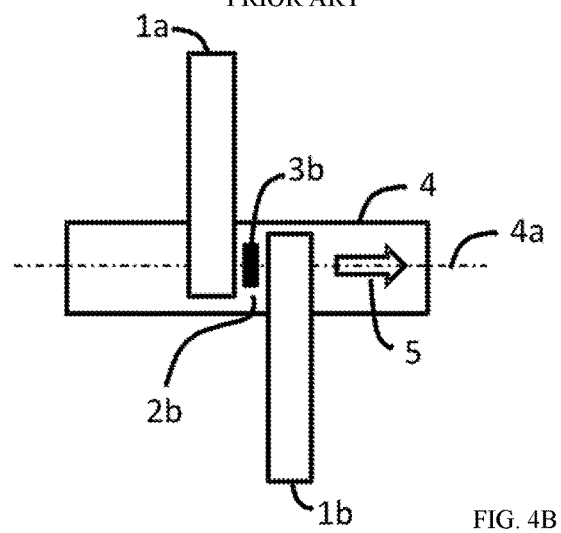
Figure 17:
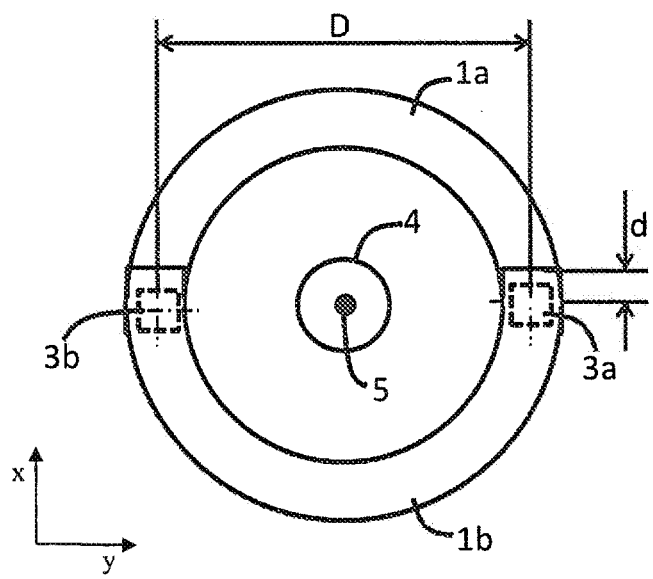
FIG. 17 illustrates dimensional properties of the ferromagnetic core of the prior art transducers.

The essential common feature of the current transducers of the prior art is that their ferromagnetic cores 1, or the pieces thereof, are only as long as necessary for closing the magnetic circuit around the cable 4 for the magnetic field of the primary current. In FIGS. 1, 2A, 2B and 3, the ferromagnetic core 1 or core pieces 1a and 1b just form a ring-shaped magnetic circuit. In FIGS. 4A and 4B, the core pieces 1a and 1b are only as long as necessary to overlap the magnetic field sensors 3a and 3b. FIG. 17 illustrates the dimensional properties of the ferromagnetic core 1 of the prior art transducers. With the prior art current transducers, the median diameter of the ferromagnetic core 1 (or the length of a side in the case of a ferromagnetic core 1 having an approximately rectangular shape), denoted by D, is much greater than the distance d between a foot 10 of the core piece 1a or 1b and the centre of the nearest magnetic field sensor 3a or 3b. Typically, d<1/10 D. The prior art core pieces therefore do not have a leg that reduces the influence of an external magnetic field.

With the present invention, the length A of the legs 12 of the ferromagnetic core 1 is in a first approximation about half the diameter of the ring-shaped portion 21, denoted by D. That is A≈½ D. However, depending on the shape of the ferromagnetic core 1, the relation between A and D may be slightly different, but for the optimum length $A_{opt}$ typically, ⅓ D<$A_{opt}$<⅔ D. The length of the legs 12 must be long enough, so that almost all magnetic field lines of an external disturbing magnetic field collected in the three-dimensional space enter into the leg near its feet and not at the locations of the magnetic field sensors, but must on the other hand side not be too long.

Figure 18A:
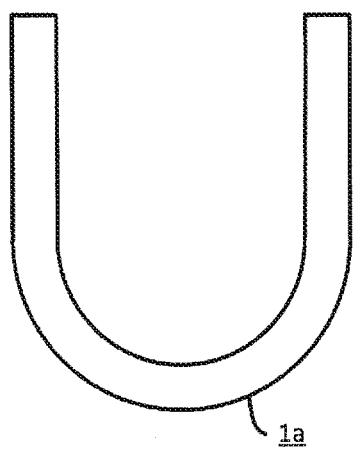
FIGS. 18A, 18B, 18C, 18D, 18E, 18F and 18G show different variations of pieces suitable to build the ferromagnetic core according to the invention.
Figure 18B:
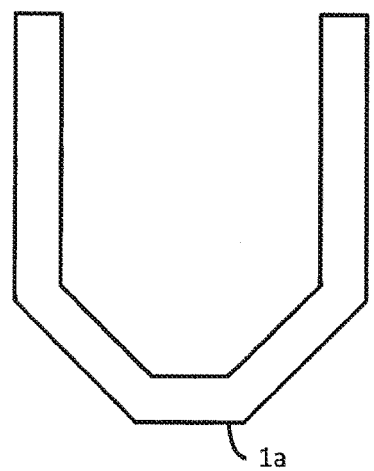
Figure 18C:
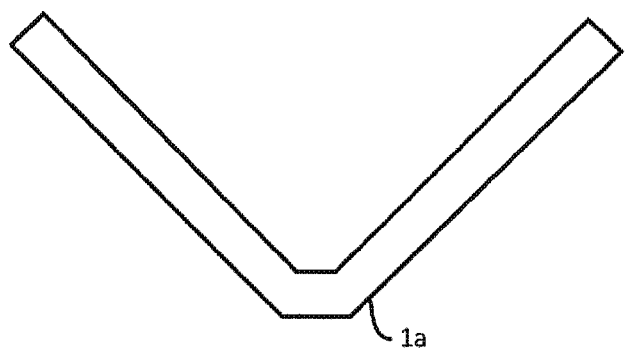
Figure 18D:
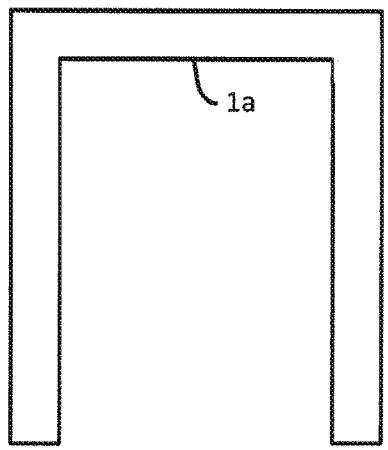
Figure 18E:
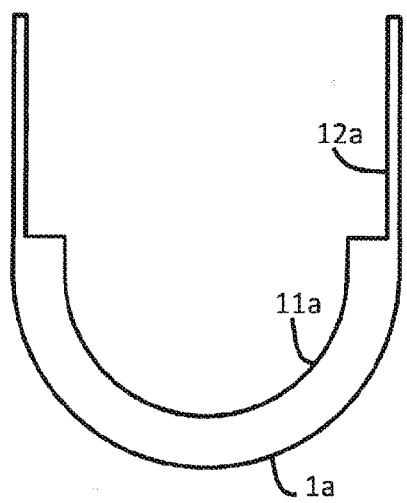
Figure 18F:
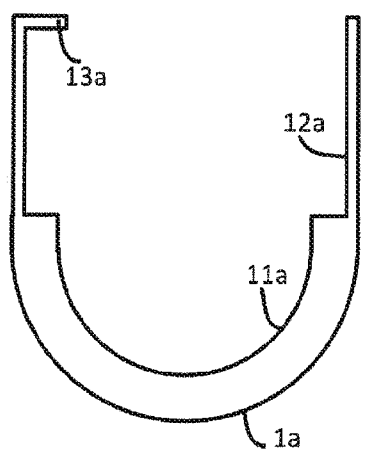
Figure 18G:
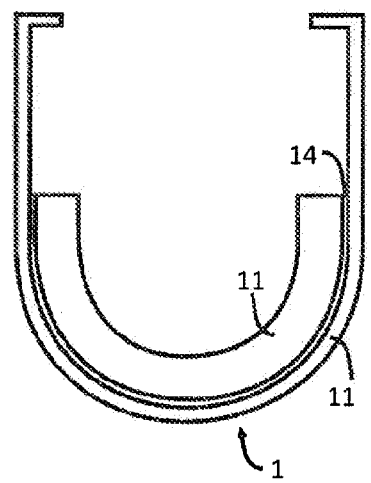

FIGS. 18A, 18B, 18C, 18D, 18E, 18F and 18G show some variations of the approximately U-shaped pieces 1a, 1b, 1c of the ferromagnetic core 1 that could also be used to build the ferromagnetic core 1. Apart from the round form of the belt of the U-shaped piece 1a as shown in FIG. 11, the belt may also have the shape of a cornered U (FIG. 18B), a V (FIG. 18C). The core pieces 1a, 1b, 1c may also have the form of a capital Greek Pi (FIG. 18D), and so on. Moreover, the belt and the legs can be of different thickness or the legs may be bent or have bent ends. Such examples are shown in FIGS. 18E and 18F. The bent end of a leg or a leg with larger cross-section near its foot helps reducing the overall length of the ferromagnetic pieces 1a, 1b, while keeping their function intact. The core pieces may incorporate one or more ferromagnetic layers 11 and one or more non-ferromagnetic layers 14. Such an example is shown in FIG. 18G.

In all embodiments, the thickness of the air gaps typically is about 1 mm, but is in no way limited to this value.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except by the spirit of the appended claims and their equivalents.

The invention claimed is:

1. Current transducer for measuring a current flowing through a cable, the current transducer comprising:
a ferromagnetic core with an air gap, and
a magnetic field sensor placed in or at the air gap, wherein the ferromagnetic core comprises a ring-shaped portion, a first leg and a second leg,
the ring-shaped portion encloses the cable and forms a magnetic circuit for guiding the magnetic field generated by the current flowing through the cable to the air gap,
the first leg is coupled to a first end of the ring-shaped portion near the air gap and extends in a predetermined direction that runs perpendicularly to a longitudinal axis of the cable,
the second leg is coupled to a second end of the ring-shaped portion near the air gap and extends in a direction opposite to the predetermined direction, and
a length of the first and second leg is designed so long that at least two magnetic paths are formed which guide a component of an external magnetic field which extends in the predetermined direction around the magnetic field sensor.

2. Current transducer according to claim 1, wherein the first end of the ring-shaped portion and the second end of the ring-shaped portion lie opposite to each other and are separated by the air gap and the magnetic field sensor is oriented such that a sensitivity direction of the magnetic field sensor runs parallel to the predetermined direction.

3. Current transducer according to claim 1, wherein the air gap is formed between end portions of the ring-shaped portion which lie above each other when seen in the direction of the longitudinal axis of the cable, and the magnetic field sensor is oriented such that a sensitivity direction of the magnetic field sensor runs parallel to the longitudinal axis of the cable, and wherein the ferromagnetic core comprises further legs which extend parallel to the longitudinal direction of the cable and are coupled to the ring-shaped portion near the air gap wherein a length of the further legs is selected such that further magnetic paths are formed which guide a component of an external magnetic field which runs parallel to the longitudinal direction of the cable around the magnetic field sensor.

4. Current transducer for measuring a current flowing through a cable, the current transducer comprising:
a ferromagnetic core with two air gaps, and
two magnetic field sensors each placed in or at one of the air gaps, wherein
the ferromagnetic core comprises a ring-shaped portion, a first pair of legs and a second pair of legs,
the ring-shaped portion encloses the cable and forms a magnetic circuit for guiding the magnetic field generated by the current flowing through the cable to the air gaps,
the first air gap and the second air gap lie at diametrically opposite sides with respect to a center of the ring-shaped portion,
the first leg of the first pair is coupled to a first end of the ring-shaped portion near the first air gap and extends in a predetermined direction that runs perpendicularly to a longitudinal axis of the cable,
the second leg of the first pair is coupled to a second end of the ring-shaped portion near the first air gap and extends in a direction opposite to the predetermined direction, and
the first leg of the second pair is coupled to the ring-shaped portion near the second air gap and extends in the predetermined direction, the second leg of the second pair is coupled to the ring-shaped portion near the second air gap and extends in a direction opposite to the predetermined direction, and a length of the first and second leg is designed so long that at least four magnetic paths are formed which guide a component of an external magnetic field which extends in the predetermined direction around the magnetic field sensors.

5. Current transducer according to claim 4, wherein the first end of the ring-shaped portion and the second end of the ring-shaped portion lie opposite to each other and are separated by the first air gap, the first magnetic field sensor is oriented such that a sensitivity direction of the first magnetic field sensor runs parallel to the predetermined direction, the ring-shaped portion has two further ends which lie opposite to each other and are separated by the second air gap and the second magnetic field sensor is oriented such that a sensitivity direction of the second magnetic field sensor runs parallel to the predetermined direction.

6. Current transducer according to claim 4, wherein the first air gap is formed between end portions of the ring-shaped portion which lie above each other when seen in a direction of the longitudinal axis of the cable, the second air gap is formed between portions of the ring-shaped portion which lie above each other when seen in the direction of the longitudinal axis of the cable, and the first and second magnetic field sensor are oriented such that a sensitivity direction of the first and second magnetic field sensor runs parallel to the longitudinal axis of the cable, and wherein the ferromagnetic core comprises further legs which extend parallel to the longitudinal direction of the cable and are coupled to the ring-shaped portion near the first air gap and the second air gap wherein a length of the further legs is selected such that further magnetic paths are formed which guide a component of an external magnetic field which runs parallel to the longitudinal direction of the cable around the magnetic field sensors.

* * * * *